United States Patent
Xie et al.

(10) Patent No.: US 11,709,733 B2
(45) Date of Patent: Jul. 25, 2023

(54) METADATA-ASSISTED ENCODING AND DECODING FOR A MEMORY SUB-SYSTEM

(71) Applicant: MICRON TECHNOLOGY, INC., Boise, ID (US)

(72) Inventors: Tingjun Xie, Milpitas, CA (US); Ying Yu Tai, Mountain View, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 17/216,574

(22) Filed: Mar. 29, 2021

(65) Prior Publication Data

US 2021/0216402 A1 Jul. 15, 2021

Related U.S. Application Data

(62) Division of application No. 16/265,690, filed on Feb. 1, 2019, now Pat. No. 10,963,342.

(51) Int. Cl.
| | |
|---|---|
| *G06F 11/10* | (2006.01) |
| *G06F 11/00* | (2006.01) |
| *H03M 13/13* | (2006.01) |
| *H03M 13/00* | (2006.01) |
| *G06F 12/02* | (2006.01) |

(52) U.S. Cl.
CPC ...... *G06F 11/1076* (2013.01); *G06F 11/1004* (2013.01); *G06F 12/023* (2013.01); *H03M 13/13* (2013.01)

(58) Field of Classification Search
CPC ............. G06F 11/1076; G06F 11/1004; G06F 12/023; H03M 13/13
See application file for complete search history.

(56) References Cited

U.S. PATENT DOCUMENTS

| | | | |
|---|---|---|---|
| 9,819,361 B2 * | 11/2017 | Shin | .................... H03M 13/134 |
| 9,846,718 B1 | 12/2017 | Ruef et al. | |
| 10,142,060 B2 | 2/2018 | Xu | |
| 10,312,946 B2 | 6/2019 | Koike-Akino | |
| (Continued) | | | |

FOREIGN PATENT DOCUMENTS

| | | |
|---|---|---|
| KR | 20140050152 A | 4/2014 |
| WO | 2016154079 A1 | 9/2016 |
| WO | 2018028509 A1 | 2/2018 |

OTHER PUBLICATIONS

PCT Notification of Transmittal of the International Search Report and the Written Opinion of the International Searching Authority for PCT Application No. PCT/US2020/016184, dated Jun. 11, 2020 11 pages.

*Primary Examiner* — Justin R Knapp
(74) *Attorney, Agent, or Firm* — Lowenstein Sandler LLP

(57) ABSTRACT

Data to be stored at a memory sub-system can be received from a host system. A portion of the host data that includes user data and another portion of the host data that includes system metadata can be determined. A mapping for a data structure can be received that identifies locations of the data structure that are fixed with respect to an encoding operation and locations of the data structure that are not fixed with respect to the encoding operation. The data structure can be generated for the user data and system metadata based on the mapping, and an encoding operation can be performed on the data structure to generate a codeword.

20 Claims, 7 Drawing Sheets

(56) References Cited

U.S. PATENT DOCUMENTS

| | | |
|---|---|---|
| 10,742,238 B2 | 8/2020 | Lin |
| 2012/0290898 A1 | 11/2012 | Franceschini et al. |
| 2014/0019820 A1* | 1/2014 | Vardy .................. H03M 13/13 714/752 |
| 2015/0212882 A1 | 4/2015 | Larsen |
| 2015/0295593 A1* | 10/2015 | Trifonov ........... H03M 13/3746 714/776 |
| 2017/0235636 A1 | 8/2017 | Zhou |
| 2018/0287640 A1 | 10/2018 | Lin et al. |
| 2018/0287738 A1 | 10/2018 | Xu et al. |
| 2020/0036477 A1 | 1/2020 | Xu et al. |
| 2020/0067529 A1 | 2/2020 | Hui et al. |
| 2020/0099393 A1 | 3/2020 | Xu et al. |
| 2020/0177211 A1 | 6/2020 | Fazeli Chaghooshi et al. |
| 2020/0358555 A1 | 11/2020 | Chen et al. |

\* cited by examiner

US 11,709,733 B2

METADATA-ASSISTED ENCODING AND DECODING FOR A MEMORY SUB-SYSTEM

RELATED APPLICATIONS

This application is a divisional application of co-pending U.S. patent application Ser. No. 16/265,690, filed Feb. 1, 2019, which is herein incorporated by reference.

TECHNICAL FIELD

The present disclosure generally relates to a memory sub-system, and more specifically, relates to metadata-assisted encoding and decoding for memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
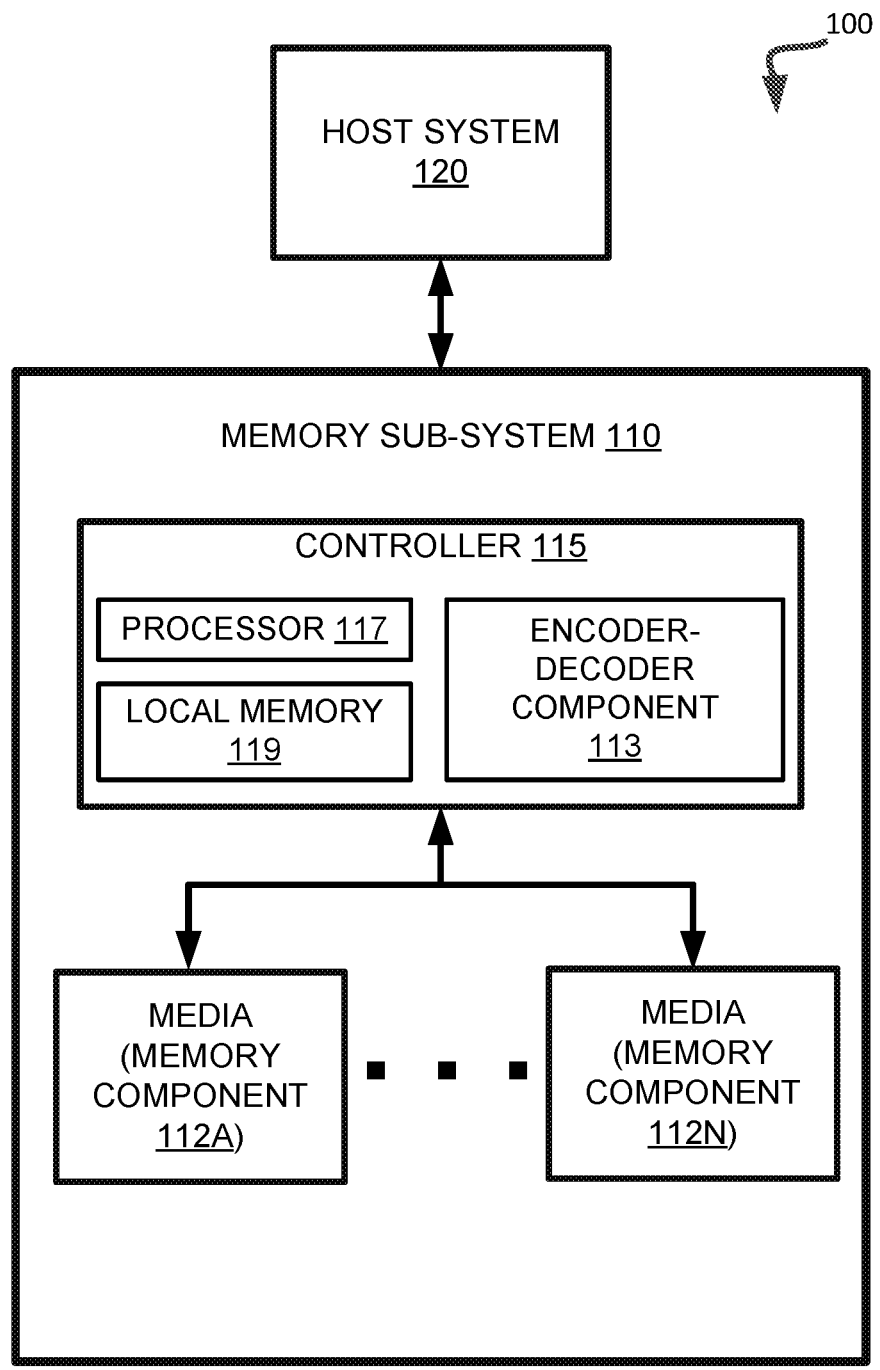
FIG. 1 illustrates an example computing environment that includes a memory sub-system in accordance with some embodiments of the present disclosure.

Aspects of the present disclosure are directed to metadata-assisted encoding and decoding for memory sub-systems. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A conventional memory sub-system can implement an error detection and correction (i.e., an error control) operation for the data that is stored at and/or retrieved from the memory components of the memory sub-system. The error control operation can utilize an error correcting code (ECC) to encode host data and store the encoded host data at the memory sub-system. For example, the host data can be encoded to generate a codeword and the codeword can be stored at the memory sub-system. Subsequently, when the host system requests the host data, the codeword can be decoded to generate the host data. The encoding and decoding of the error control operation can be used to detect any errors that may have been caused by noise or other such impairments that can cause a value or bit of the host data to switch (e.g., from a '0' value to a '1' value or vice versa) when the host data is stored or read. The detected error can subsequently be corrected based on the error control operation.

The error correcting code utilized by the error control operation of the conventional memory sub-system can be designed based on channel coding for data stored at the conventional memory sub-system. For example, locations of particular bits (e.g., which correspond to certain bit channels) in a codeword more prone to error because of noise ('bad' bit channels) can be less desirable to store valuable host data than those less prone to error ('good' bit channels). Error control operations of conventional memory sub-systems can identify the 'good' bit channels (typically referred to as 'unfrozen bits') and use those bit channels (or a subset of them) for storing host data and relevant metadata, while using the 'bad' bit channels for parity bits that are predetermined or defined fixed values known by the encoder and the decoder (typically referred to as 'frozen bits'). The host data and relevant metadata can then be interlaced with the frozen data to construct the codeword. Polar codes belong to this type of channel coding.

Conventional memory sub-systems that encode in this manner can often intentionally limit the number of frozen bits used in order to increase the amount of host data in the resulting codeword. In such cases, fewer frozen bits in relation to the amount of host data can result in a weaker error correcting code, since the amount of data that requires verification during the decode process is proportionally larger than the amount of data that does not. In some cases, weaker error correcting code implementations can be supplemented by appending additional error check codes to the codeword to improve the decoding capability. This, however, can often increase execution time and decrease overall performance since the decoding process and error handling are typically implemented as separate operations. The decode process can often attempt to decode the entire codeword before executing any error check process, analyzing all potential candidates for the decoded host data. Thus, the decode operation can often spend both unnecessary time and computing resources on analyzing candidates for the decoded host data that later are determined to be invalid.

Aspects of the present disclosure address the above and other deficiencies by utilizing metadata-assisted encoding and decoding for memory sub-systems. In some embodiments, a polar encoder and a polar decoder can be used for the metadata-assisted encoding and decoding for the memory sub-system. The polar encoder can supplement the frozen bits used to generate a codeword with additional metadata partly or fully known by the system. For example, the polar encoder can utilize system metadata information that is a component of a request to store or read host data. The polar decoder process can utilize the supplemental frozen bits which are from the system metadata of known bit values in eliminating potential candidates for the decoded host data. For example, the polar decoder can eliminate potential candidates for the decoded host data where the known system metadata is not present at the expected locations (e.g., at the known locations of the frozen bits). Additionally, the polar decoder can perform the decoding operation in stages such that each sector of decoded host data can be checked using a check code for that sector before continuing on to the next sector. The check results on the decoded host data can be used by the polar decoder to eliminate potential candidates for the decoding process of the remaining sectors.

Advantages of the present disclosure include, but are not limited to, the generation of a more robust error correction code as well as a more efficient decode process. The system metadata used to supplement the number of frozen bits used in the encoding process can increase the proportion of frozen data to host data, thus improving the reliability of the error correction code. Additionally, the use of system metadata can result in improved flexibility of both the encode and decode process since the metadata may already be included in typical read and write requests. Similarly, the use of the additional frozen bits can improve the efficiency of the decode process both in terms of time and computational resources. By increasing the number of known frozen bits, the decode process can more efficiently eliminate candidates for the decoded host data that do not match the known system metadata. Moreover, by decoding a codeword in stages, additional candidates can be eliminated based upon check results provided by the check code. Thus, computational resource usage of the memory sub-system can be dramatically reduced by eliminating additional invalid candidates, thereby further improving the decoding process efficiency.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an encoder-decoder component 113 that can be used to encode host data to generate codewords that are to be stored at the memory components 112A to 112N and to decode the codewords to generate host data. In some embodiments, the controller 115 includes at least a portion of the encoder and decoder component 113. For example, the controller 115 can include a processor 117 (processing device) configured to execute instructions stored in local memory 119 for performing the operations described herein. In some embodiments, the encoder-decoder component 113 is part of the host system 120, an application, or an operating system.

The encoder-decoder component 113 can receive host data that includes user data and system metadata associated with the user data. The host data can then be encoded based at least in part on the included system metadata. For example, some portion of the system metadata are known to the memory sub-system 110 and can be used to increase the number frozen bits incorporated into an encoding operation (e.g., a polar encoding operation) to generate an encoded codeword that is stored at one or more memory components of memory sub-system 110 (e.g., memory components 112A to 112N). Subsequently, the encoder-decoder component 113 can receive a request for host data stored in memory components 112A to 112N, retrieve the codeword associated with the host data, and perform a decoding operation (e.g., a polar decoding operation) on the codeword. Further details with regards to the operations of the encoder-decoder component 113 are described below.

Figure 2:
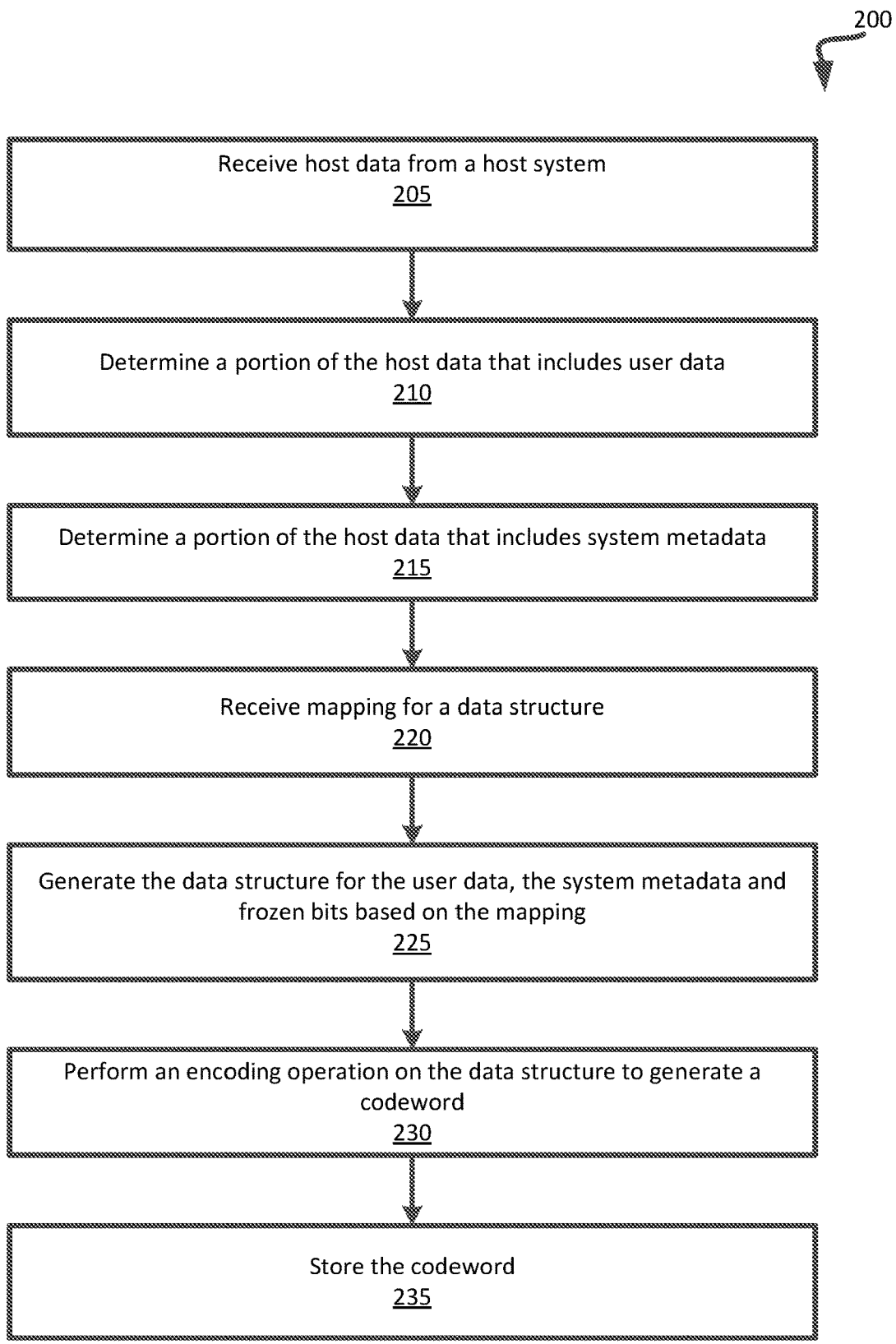
FIG. 2 is a flow diagram of an example method to perform metadata-assisted encoding for a memory sub-system.

FIG. 2 is a flow diagram of an example method 200 to perform metadata-assisted encoding for a memory sub-system. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the encoder-decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 205, the processing logic receives host data from a host system. For example, a host system can provide data (i.e., host data) that is to be stored at the memory sub-system. In some embodiments, the host data can include both user data (e.g., data associated with a user related process or operation, commonly appearing in the form of host data sectors) and system metadata (e.g., one or more predetermined values that are known by and received from the host system, such as sector check codes). At operation 210, the processing logic determines a portion of the host data that includes user data. In some embodiments, the processing logic receives the host data in a request to store the data, where the request indicates what portion of the data is user data. For example, the request can be structured so that the user data is included at a particular offset within the request packet. At operation 215, the processing logic determines another portion of the host data that includes the system metadata. In some embodiments, the system metadata can include metadata received from the host system. For example, the system metadata can include a logical block address (LBA), supplemental system metadata (e.g., a number of bits used for system management information), sector check code information, global check code information (e.g., check code information for the entire host data), or other similar data associated with the host system, the memory sub-system, or the like. In some embodiments, the system metadata can include metadata added by the memory sub-system, such as data used for sub-system management purposes. In such cases, this additional system metadata added by the memory sub-system can be added at operation 215.

At operation 220, the processing logic receives a mapping for a data structure. The mapping can be used by the encoding operation to determine the organization of both the user data and the system metadata included in the resulting encoded codeword. In some embodiments, the mapping can identify one set of locations within the data structure that are fixed bit values with respect to the encoding operation and another set of locations within the data structure that are not fixed bit values with respect to the encoding operation. For example, the set of locations within the data structure that are fixed bit values can include the frozen bits of a polar code, and the set of locations within the data structure that are not fixed bit values can include the unfrozen bits of the polar code.

At operation 225, the processing logic generates the data structure for the user data, the system metadata, and additional frozen bits (i.e. the bit sequence with a fixed pattern) based on the mapping received by operation 220. In some implementations, the data structure can be generated such that the user data and a portion of system metadata are placed at the locations in the mapping that are not fixed bit values. Additionally, a different portion of the system metadata can be placed at the locations in the mapping table that are fixed bit values. For example, in preparation for a polar encoding process, the user data and one portion of the system metadata can be selected for the unfrozen bits and another portion of the system metadata can be selected for the frozen bits. In some embodiments, a portion of the system metadata that is received from the host system or memory sub-system can be regarded as frozen bits since it is known by the polar encoder and decoder process. In some embodiments, the processing logic can further supplement the frozen bits in the data structure with an additional bit sequence that has a fixed pattern. Thus, the data structure can include user data, system metadata regarded as unfrozen bits, system metadata regarded as frozen bits, and an additional fixed bit pattern regarded as frozen bits. Further details with respect to the mapping and data structure generation operations are described below in conjunction with FIG. 3.

At operation 230, the processing logic performs an encoding operation on the data structure to generate a codeword. The encoding operation can be a linear transformation of the data. For example, the encoding operation can be performed on the collection of both frozen and unfrozen bits and can perform a linear transformation of the data to generate a codeword. An example of such an encoding operation includes, but is not limited to, a polar code or polar encoding operation. A polar code can be a linear block error correcting code that applies a matrix to the data to transform the data into the codeword. The parity bits of the codeword can be additional bits that are used to detect and correct any errors when the codeword is later retrieved. In some embodiments, the parity bits can be based on or calculated by values of the bits of the data that is to be encoded. As such, the codeword can include the data that is to be encoded and the parity bits for this data. In some embodiments, the parity bits can be the frozen bits as described above. At operation 235, the processing logic stores the codeword. For example, the codeword can be stored in one or more memory components at the memory sub-system.

Figure 3:
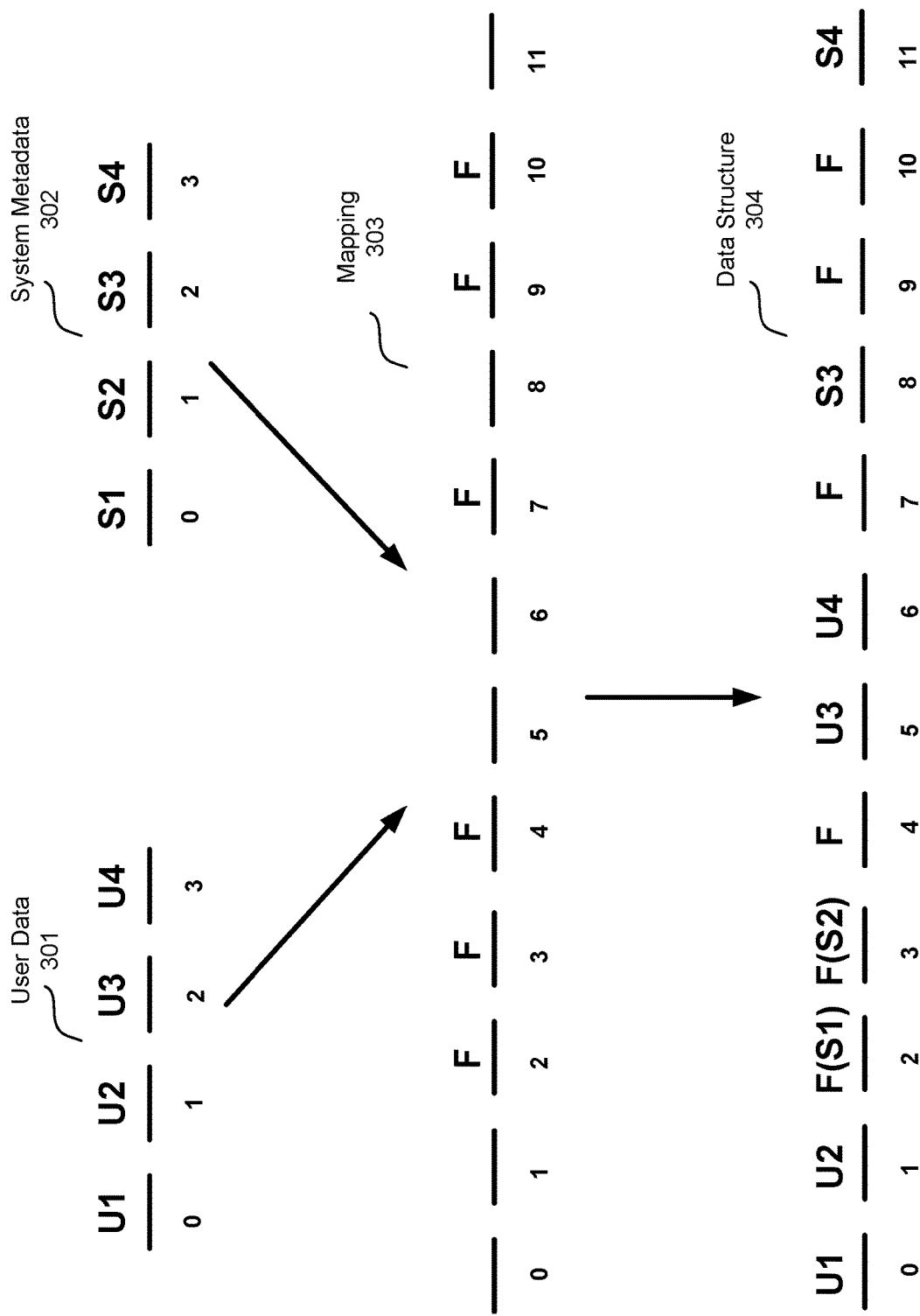
FIG. 3 illustrates the generation of a data structure for codeword encoding based on a mapping of fixed and not fixed data in accordance with some embodiments of the present disclosure.

FIG. 3 illustrates the generation of a data structure for codeword encoding based on a mapping of fixed and not fixed bit values in accordance with some embodiments of the present disclosure. The data structure generation can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, data structure generation can be performed by the encoder-decoder component 113 of FIG. 1.

As shown in FIG. 3, user data 301 can be interlaced with system metadata 302 to generate a combined data structure 304 that can be used during an encoding operation as described herein. In some embodiments, user data 301 can represent the non-fixed data that is to be encoded. For example, as described above, user data 301 can include information that a host process requests to be encoded and stored in a memory sub-system. As shown in in FIG. 3, user data 301 can include four bits U1, U2, U3, and U4. System metadata 302, which is also used during the encoding process, can include information received from a host system in a request to store data such as a logical block address, supplemental system administrative data, or the like. System metadata 302 may additionally include system metadata added by the memory sub-system and a portion of system metadata 302 can be non-fixed data (i.e. unfrozen bits). In some embodiments system metadata 302 can be associated with user data 301. For example, a portion of system metadata 302 is generated based on the content of user data 301. As shown in in FIG. 3, system metadata 302 can include four bits S1, S2, S3, and S4.

Mapping 303 can represent a predetermined layout of the location of fixed data (e.g., frozen bits) and non-fixed data that can be used to generate the data structure 304. The layout of mapping 303 can be predetermined by both the polar code structure and the partly or fully fixed system metadata bits. In some embodiments the mapping 303 can be also be utilized during a decoding operation to eliminate potential candidates for the decoded data from consideration. As shown in FIG. 3, in an illustrative example, assuming two bits S1 and S2 are fixed bit values (known by both encoder and decoder) in the system metadata and the adoption of a polar code of length twelve with four frozen bits, the mapping 303 can include twelve bits, six of which are designated as fixed. The fixed bits are designated in mapping 303 with an 'F' in the applicable bit position. Thus, positions 2, 3, 4, 7, 9, and 10 are designated as fixed bits for mapping 303. In some embodiments the positions designated as fixed can be propagated with system metadata 302. Alternatively, these positions can be propagated with a portion of the data from system metadata 302 as well as an additional sequence of predetermined fixed bit values known a-priori by the encoder and decoder.

Data structure 304 can be generated by applying mapping 303 to user data 301 and system metadata 302. As shown in in FIG. 3, since mapping 303 indicates that positions 2, 3, 4, 7, 9, and 10 should be fixed data, those positions in data structure 304 can be propagated with S1 and S2 (two fixed bit values) in system metadata 302 as well as a predetermined sequence of four fixed bit values which are agreed a-priori by both encoder and decoder. The four fixed bit values can be set to any pattern, such as '0000', '1111', or any combination thereof. Thus, in one embodiment, positions 2 and 3 in data structure 304 can be propagated with S1 and S2 respectively. Similarly, positions 4, 7, 9, and 10 can be propagated with the additional fixed bit pattern. In other embodiments, the data structure 304 can be generated such that the known system metadata values are propagated into different fixed data positions or in a different order. For example, positions 9 and 10 in data structure 304 can be propagated with S1 and S2 respectively, or positions 2 and 3 in data structure 304 can be propagated with S2 and S1 respectively, and so on. Similarly, in some embodiments, all four bits in system metadata 302 (e.g., S1, S2, S3, and S4) can be fixed values known by both encoder and decoder. Thus, mapping 303 can indicate that all four bits from system metadata 302 can be propagated into four out of six fixed bit positions, leaving the remaining two fixed bit positions to be propagated with the additional fixed bit pattern which is agreed a-priori by both encoder and decoder.

Similarly, since mapping 303 indicates that positions, 0, 1, 5, 6, 8, and 11 should be propagated with data that is not fixed (e.g., user data and the portion of system metadata that is not designated as fixed), those positions in data structure 304 are propagated with values from user data 301 and any portions of system metadata 302 not designated as fixed bits (e.g., S3 and S4). Thus, in one embodiment, positions 0, 1, 5, and 6 in data structure 304 can be propagated with U1, U2, U3, and U4 respectively. Additionally, positions 8, and 11 can be propagated with S3 and S4 respectively. In other embodiments, the data structure 304 may be generated such that the user data and remaining portions of system metadata values are propagated into the fixed data positions in a different order. For example, positions 0, 1, 5, 6, 8, and 11 in data structure 304 can be propagated with U4, U3, U2, U1, S4, and S3 respectively, and so on. It should be noted that for simplicity of illustration, user data 301 and system metadata 302 have been depicted with a size of four bits, but other embodiments can include fewer bits or more bits. Similarly, mapping 303 and data structure 304 can include fewer or more bits than the twelve depicted.

Figure 4:
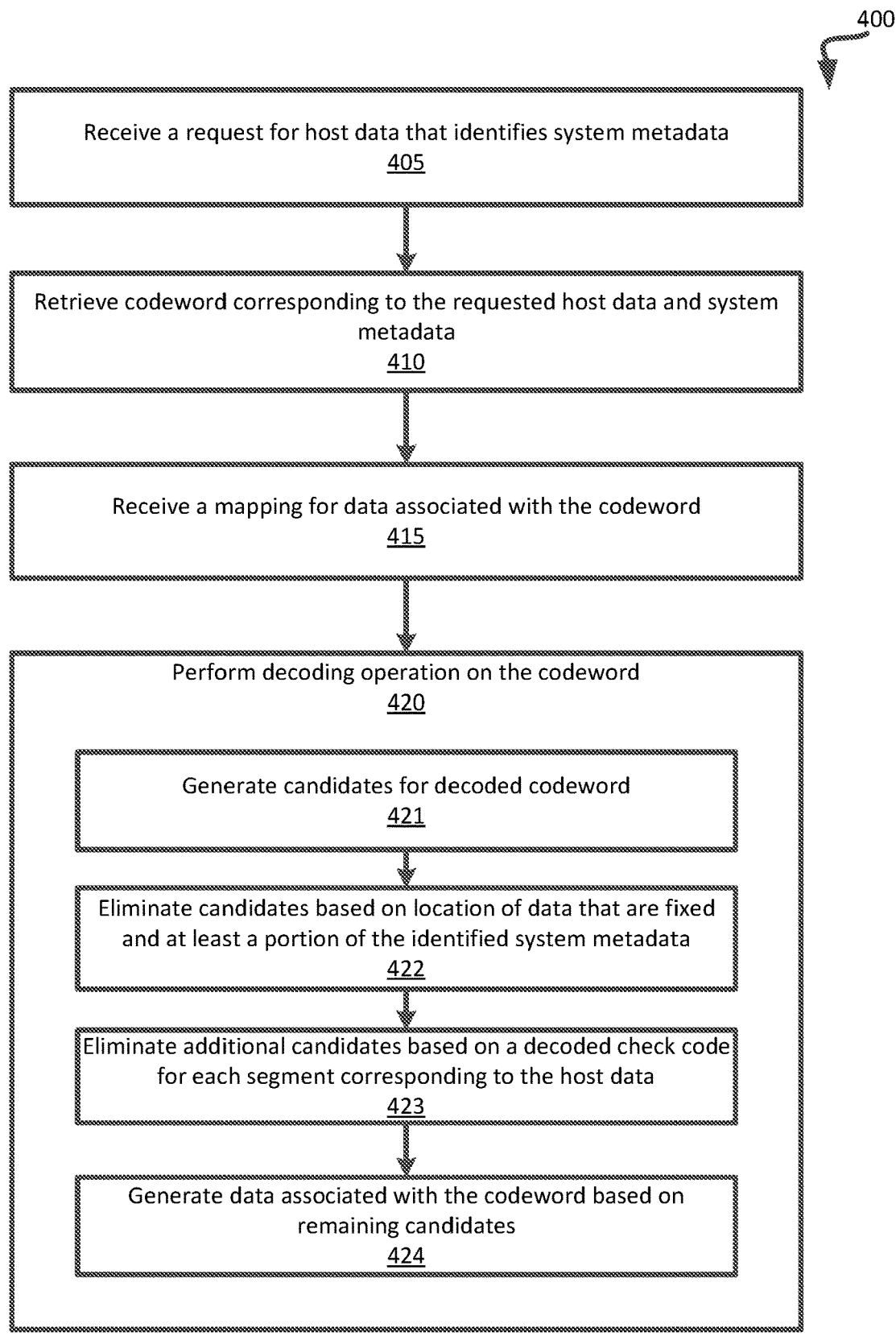
FIG. 4 is a flow diagram of an example method to perform metadata-assisted decoding for a memory sub-system.

FIG. 4 is a flow diagram of an example method 400 to perform metadata-assisted decoding for a memory subsystem in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the encoder-decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 405, the processing logic receives a request for host data that identifies system metadata. In some embodiments, the request can include system metadata that is associated with the host data to be retrieved. For example, the request can be a request received from a host system to read host data associated with a particular logical block address (LBA). In some embodiments, a portion of the system metadata can be identified by the sub-system as fixed data (e.g., frozen bits) incorporated in the codeword. The identified fixed data can then be utilized during the decoding operation described below with respect to operations 421-424.

At operation 410, the processing logic retrieves a codeword corresponding to the requested host data and system metadata. The codeword can be retrieved in response to the read request of operation 405 that specifies host data that was previously encoded into the codeword. As previously described, the codeword can include a first portion that corresponds to user data and a second portion that corresponds to system metadata. In some embodiments, the codeword can be made up of a series of segments. For example, the codeword can include a set of segments that correspond to different host data sectors included within the codeword. Additionally, the codeword can include another set of segments that correspond to check codes for each segment that includes a host data sector. Thus, the segments can be organized in pairs such that each host data sector is paired with a corresponding check code. In some embodiments, the check code can be a cyclic redundancy check (CRC) code. A CRC code is an error-detecting code that can be used to detect unintentional changes to the data.

At operation 415, the processing logic receives a mapping for data associated with the codeword. In some embodiments, the mapping identifies locations of the data that are fixed with respect to a decoding operation (e.g., frozen bits). For example, the mapping can be the mapping described above in conjunction with operation 220 of FIG. 2.

At operation 420, the processing logic performs a decoding operation on the codeword retrieved by operation 410 to generate host data. For example, a polar decoder can be used to decode the codeword to generate the host data. In some embodiments, processing logic can perform the decoding operation by further invoking operations 421-424. At operation 421, processing logic generates possible candidates for the decoded codeword that correspond to written data associated with the codeword (e.g., the data originally written for the codeword). For example, the processing logic can generate a list of candidates that can potentially match the expected decoded data. At operation 422, processing logic eliminates one or more of the potential candidates based on the locations of the data that are fixed (e.g., frozen bits) and at least a portion of the identified system metadata. For example, a portion of system metadata that are known values to both encoder and decoder can be considered frozen bits by the decoder and used to eliminate the potential candidates. In some embodiments, processing logic can first determine the locations of the data associated with the codeword that are fixed based on the mapping received at operation 415. Processing logic can then compare the data associated with the codeword at these locations (e.g., the predetermined portion of system metadata and fixed data pattern that can be used as frozen bits) to the bits in the potential candidates at the corresponding bit locations. Processing logic can then eliminate candidates from the list of potential candidates based on the comparison results at the locations identified in the mapping as fixed. For example, if the bit pattern of a potential candidate does not match the known frozen bits at the locations designated as fixed by the mapping table, the candidate can be eliminated. Further details with respect to eliminating potential candidates for decoded data based on the frozen bits (fixed system metadata) are described below in conjunction with FIG. 5A.

At operation 423, the processing logic eliminates additional candidates based on the decoded host data sector and corresponding decoded sector check code. For example, the processing logic can eliminate a candidate from the list of potential candidates if its decoded host data sector and decoded sector check code do not match. In some embodiments, processing logic can begin by determining a first subset (e.g., a proper subset) of the previously identified potential candidates based on the check result of a decoded host data sector (e.g., a segment of the codeword that contains host data) and decoded sector check code. For a potential candidate, if the processing logic determines that the decoded host data sector matches with the decoded sector check code, the potential candidate can remain in the subset. If the processing logic determines that the decoded host data sector does not match with the decoded sector check code, the potential candidate is eliminated from the subset.

Processing logic can repeat the above process for additional host data sectors in the codeword to further eliminate potential candidates. For example, processing logic can determine a second subset (e.g., a proper subset) of the previously identified subset based on the check results for another host data sector. For example, processing logic can select this subset by selecting another host data sector and validate using its associated check code. For a potential candidate, if the processing logic determines that the decoded host data sector matches with the decoded sector check code, the potential candidate can remain in the subset; if the processing logic determines that the decoded host data sector cannot match with the decoded sector check code, the potential candidate is eliminated from the subset. Further details with respect to eliminating potential candidates based on decoded data and the decoded sector check code are described below in conjunction with FIG. 5B.

At operation 424, the processing logic can generate the data associated with the codeword based on any remaining potential candidates. Furthermore, in some embodiments, the processing logic returns the host data to a host system. For example, the host data that was decoded from the codeword can be returned to the host system in response to the request received by operation 405 (e.g., a request from a host system). In some embodiments, the host data that is returned to the host system can be the last remaining potential candidate. Alternatively, the host data that is returned can be the most likely potential candidate among the potential candidates based on a probability measurement.

Figure 5A:
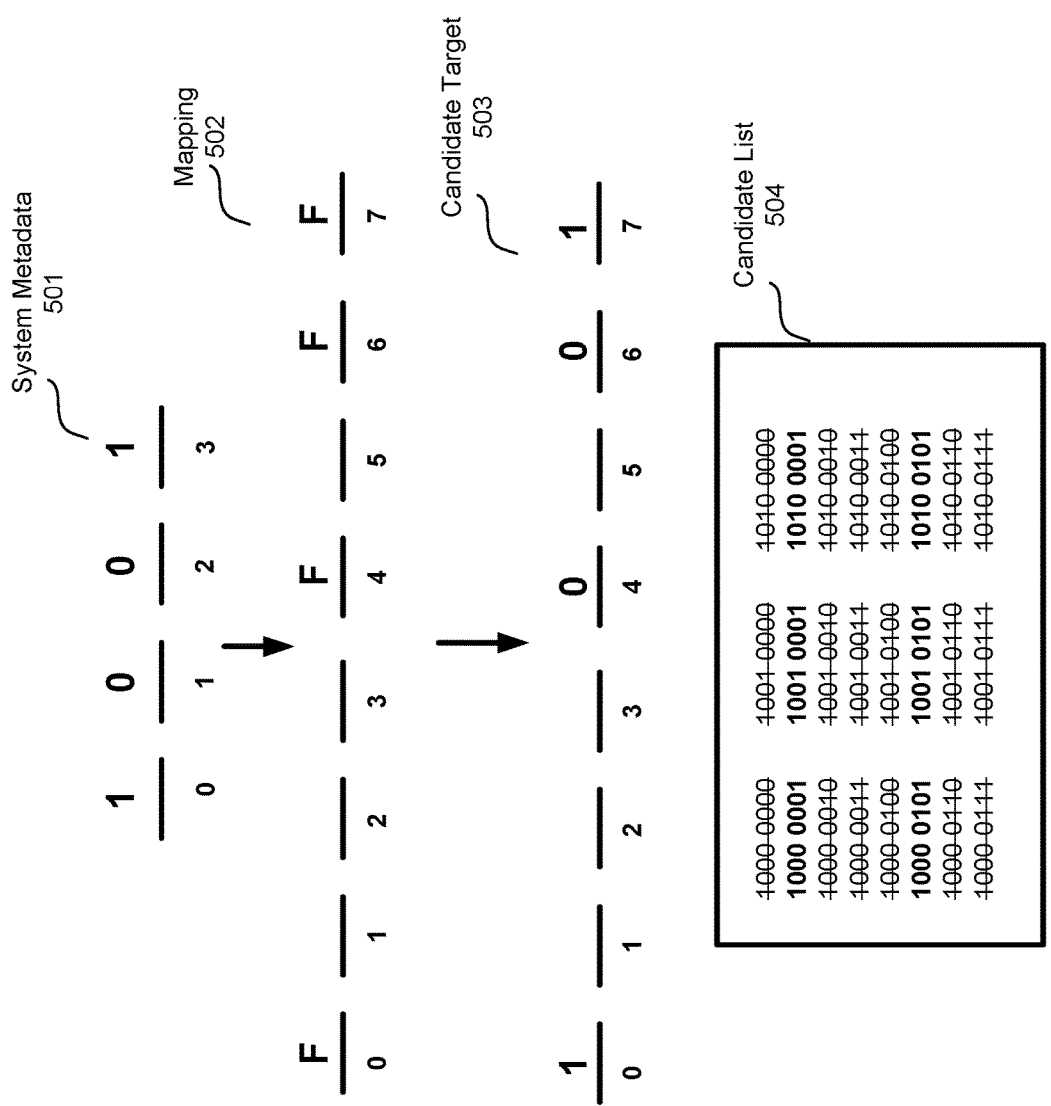
FIG. 5A illustrates eliminating potential candidates for decoded data based on fixed system metadata in accordance with some embodiments of the present disclosure.

FIG. 5A illustrates eliminating potential candidates for decoded data based on fixed system metadata in accordance with some embodiments of the present disclosure. The elimination of potential candidates can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the potential candidates can be eliminated in this manner by the encoder-decoder component 113 of FIG. 1.

As shown in FIG. 5A, the system metadata 501 can be combined with a mapping 502 to determine a candidate target 503 that can be used to eliminate potential candidates for a decoded codeword. As noted above, system metadata 501 can be either a portion of or the entire system metadata received from a host system that is associated with a request to store or read data. Alternatively, system metadata 501 can include system metadata added by a memory sub-system. As shown in in FIG. 5A, system metadata 501 can include four fixed bits '1', '0', '0', and '1'.

Also as noted above, mapping 502 can represent a predetermined layout of the location of fixed data (e.g., frozen bits) and non-fixed data that can be used to interlace user data, system metadata and possibly other frozen bits to generate a data structure that drives encoding of a codeword. Similarly, mapping 502 can be used during a decoding operation to eliminate potential candidates for the decoded codeword from consideration. In some embodiments, mapping 502 can indicate that the fixed data can be propagated with all four bits of system metadata 501. Alternatively, mapping 502 can indicate that the fixed data can be propagated with a portion of system metadata 501 as well as an additional fixed bit data pattern. As shown in in FIG. 5A, mapping 502 can include eight bits, four of which are designated as fixed. The fixed bits are designated in mapping 502 with an 'F' in the applicable bit position. Thus, positions 0, 4, 6, and 7 are designated as fixed bits for mapping 502.

In some embodiments, the metadata-assisted decoding operation as described herein can combine the system metadata 501 with mapping 502 to determine candidate target 503. As shown in FIG. 5A, candidate target 503 propagates the fixed value bits from system metadata 501 into the locations in mapping 502 that are designated as fixed bits. Thus, candidate target 503 can include fixed bit values '1', '0', '0', and '1' at positions 0, 4, 6, and 7 respectively. The decoding operation can then compare the contents of candidate target 503 to potential candidates for the decoded codeword, and eliminate those candidates that do not match candidate target 503. As shown in FIG. 5A, the decoding operation can generate candidate list 504 that includes potential candidates (e.g., potential bit pattern values) for the decoded codeword. The decoding operation can eliminate any candidate whose bit pattern does not match candidate target 503. For example, since candidate target 503 includes a '1' in positions 0 and 7, any candidate that does not include a '1' in those positions can be eliminated. Here, candidate list 504 illustrates the eliminated candidates with a strikethrough. Those candidates whose bit pattern does match candidate target 503 can be retained. Here, candidate list 504 illustrates the retained candidates in bold (e.g., '1000 0001', '1000 0101', '1001 0001', '1001 0101', '1010 0001', and '1010 0101').

In some embodiments, the decoding operation candidate list 504 is generated one bit at a time as candidate target 503 is analyzed. For example, the decoding operation analyzes mapping 502 and utilizes system metadata 501 to determine that bit position 0 is fixed (e.g., a frozen bit set to '1'). Thus, the candidate list 504 could include a single candidate of '1'. The decoder can then proceed to bit position 1 in candidate target 503. Since that position is not designated as a fixed position, the candidate list can then be updated to include '10' and '11' for the first two positions for potential candidates. The decoder can then proceed to analyze subsequent bit positions, adding to candidate list 504 until the next fixed bit position is encountered. The decoder can then eliminate candidates in candidate list 504 based on that next encountered fixed bit position. Thus, when the decoder reaches bit position 4, it can determine based on mapping 502 that the position is propagated with a fixed bit set to '0'. Thus, any bit pattern that does not include a '1' in position 0 and a '0' in position 4 can be eliminated from candidate list 504. This process can be repeated until all bit positions have been analyzed.

It should be noted that for simplicity of illustration, system metadata 501 has been depicted with a size of four bits, but in other embodiments could include fewer bits or more bits. Similarly, mapping 502 and candidate target 503 can include fewer or more bits than the eight depicted. Further, as described above with respect to FIG. 3, in some embodiments mapping 502 can be configured such that the fixed bit positions are propagated with a portion of system metadata 501 as well as an additional fixed data pattern. Moreover, while candidate list 504 depicts 24 potential candidates, in some embodiments candidate list 504 can include fewer candidates or more candidates.

Figure 5B:
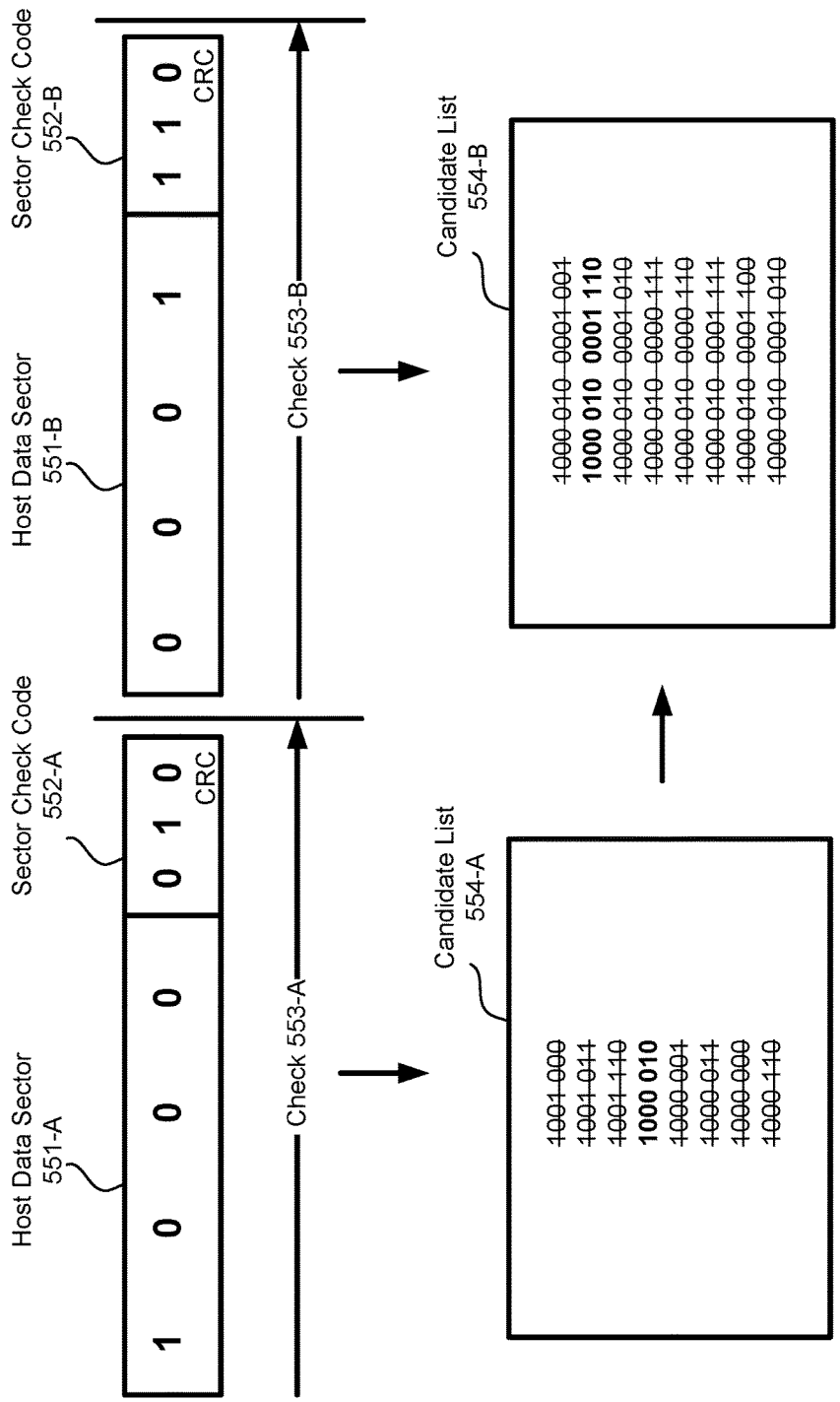
FIG. 5B illustrates eliminating potential candidates for decoded data based on the check codes associated with each host data sector segment in a codeword in accordance with some embodiments of the present disclosure.

FIG. 5B illustrates eliminating potential candidates for decoded data based on the sector check code associated with each host data sector in a codeword in accordance with some embodiments of the present disclosure. The eliminating potential candidates can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the potential candidates can be eliminated in this manner by the encoder-decoder component 113 of FIG. 1.

As described above, in some embodiments a codeword can include multiple segments, where some segments include encoded host data sectors and others include sector check codes associated with the host data sectors. A decoding operation as described above with respect to FIG. 4 can eliminate potential candidates for a decoded codeword based on validating each decoded host data sector using its corresponding decoded sector check code. In some embodiments, a cyclic redundancy check (CRC) can be used to validate the host data sector and/or the codeword generated by a polar encoder.

As shown in FIG. 5B, the decoding operation can decode a codeword that includes host data sector 551-A, sector check code 552-A, host data sector 551-B, and sector check code 552-B. It should be noted that in some embodiments, the values depicted in host data sector 551-A, sector check code 552-A, host data sector 551-B, and sector check code 552-B can be unknown to the decoder before decoding starts. It should also be noted that while for simplicity of illustration, FIG. 5B depicts two host data sector segments in the codeword, in some embodiments, the codeword can include fewer or more segments to be decoded. The decoder can check the match between the decoded host data sector and the decoded sector check code for each potential candidate (e.g. Check 553-A). For example, check 553-A can determine whether the decoded host data sector and the decoded sector check code satisfies the constraints prescribed by a property of the check code known to the decoder. If the decoded host data sector of a candidate matches the corresponding decoded sector check code of the candidate, that candidate is considered valid and can be retained in the candidate list. Conversely, if the decoded host data sector does not match the decoded sector check code, the candidate is considered invalid and will be discarded. For example, as shown in FIG. 3, for candidate '1000 010' from candidate list 554-A, the corresponding decoded host data sector and the decoded sector check code are '1000' and '010' respectively. The decoder can then verify, based on the constraints prescribed by the property of the check code, whether '010' is a valid check code value for the decoded host data sector value of '1000'. Assuming that '1000' matches '010', the candidate '1000 010' (illustrated in bold type) can be retained for further consideration by the decoding operation. Similarly, other candidates (illustrated using a strikethrough) can be eliminated because they are unable to pass the match test. This subset of candidate list 554-A can be retained to later generate candidate list 554-B and used by the decoding operation when decoding a subsequent host data sector.

In some embodiments, the decoding operation can then repeat the process for the next available host data sector in the codeword. For example, as shown in FIG. 5B, candidate list 554-B includes only the subset of potential candidates that were retained from candidate list 554-A once Check 553-A completed (e.g., those candidates that begin with a bit pattern of '1000 010'). At Check 533-B, a new round of checks between the decoded host data sector and the decoded sector check code for each potential candidate is carried out. After Check 553-B, the bit pattern '1000 010 0001 110' is retained in the subset of candidate list 554-B because decoded host data sector '0001' matches with decoded check code '110', while other candidates (illustrated using a strikethrough) are eliminated because they are unable to pass the match test. This subset of candidate list 554-B can be retained and used by the decoding operation when decoding a subsequent host data sector.

In some embodiments, upon completion of the decoding operation, if only one candidate remains in the candidate list, the remaining candidate can be deemed as the final decoding result, and the relevant host data portion will be returned to the host system. In other embodiments, upon completion of the decoding operation, multiple candidates can remain in the candidate list. In such instances, the most likely candidate (e.g., based on a probability measurement) can be deemed as the final decoding result and its relevant host data portion will be returned to the host system.

Figure 6:
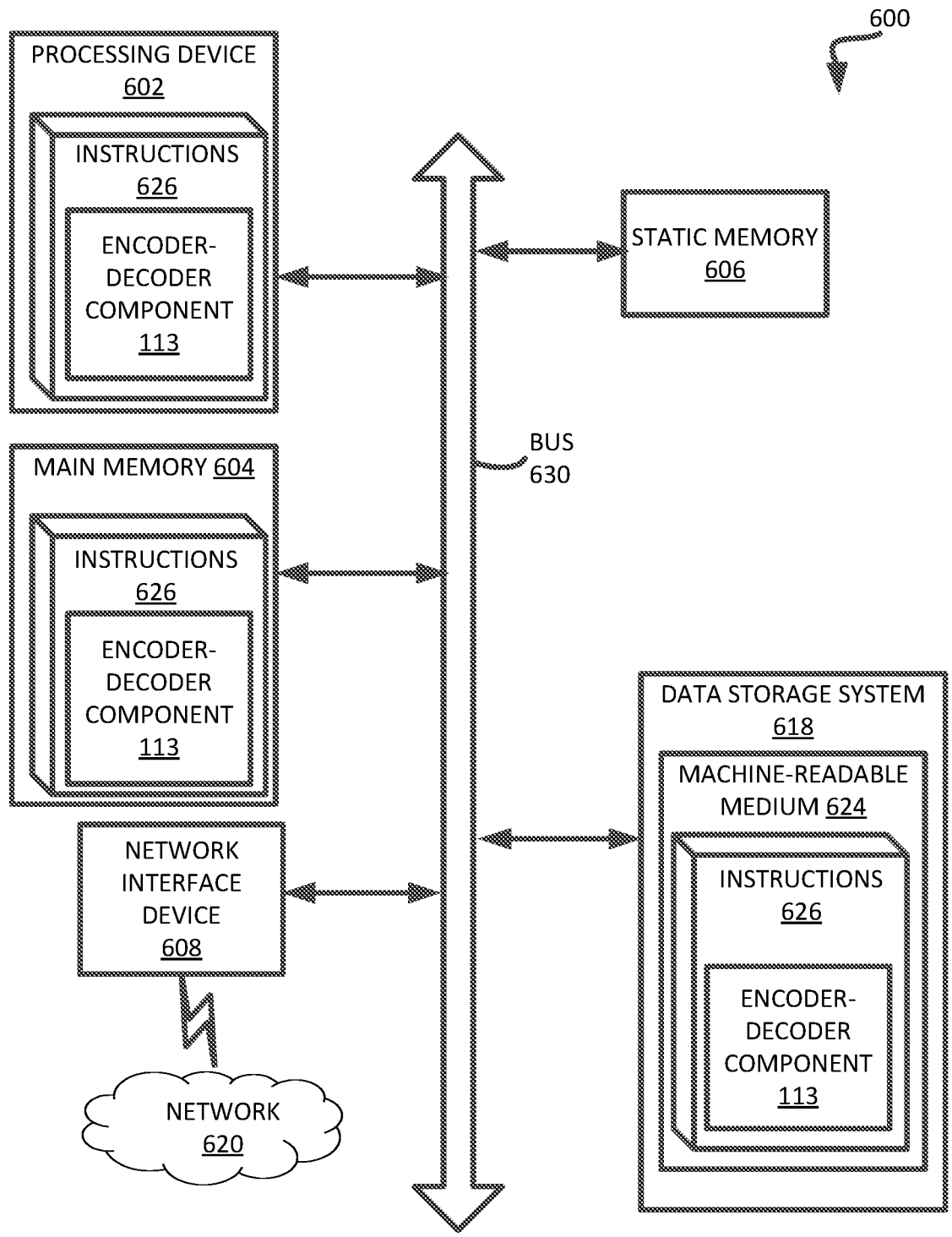
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to encoder-decoder component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an encoder-decoder component (e.g., the encoder-decoder component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving host data from a host system;
determining a portion of the host data that comprises user data;
determining another portion of the host data that comprises system metadata;
receiving a mapping for a data structure, wherein first locations of the data structure are fixed with respect to an encoding operation and second locations of the data structure are not fixed with respect to the encoding operation;
generating, by a processing device, the data structure for the user data and the system metadata based on the mapping, wherein the user data is at the second locations that are not fixed and at least a portion of the system metadata is at the first locations that are fixed; and
performing the encoding operation on the data structure to generate a codeword.

2. The method of claim 1, wherein performing the encoding operation is based on a polar code.

3. The method of claim 2, wherein the fixed locations comprise frozen bits of the polar code and the not fixed locations comprise unfrozen bits of the polar code.

4. The method of claim 1, wherein the system metadata comprises one or more defined values that received from the host system with the host data.

5. The method of claim 4, wherein the system metadata comprises at least one of a logical block address (LBA) or a supplemental metadata field.

6. The method of claim 1, further comprising:
storing the codeword at one or more memory components.

7. The method of claim 1, wherein determining the portion of the host data that comprises the user data comprises receiving a request to store the host data, wherein the request comprises the user data at a particular offset.

8. A system comprising:
a memory component; and
a processing device, operatively coupled with the memory component, to:
receive host data from a host system;
determine a portion of the host data that comprises user data;
determine another portion of the host data that comprises system metadata;
receive a mapping for a data structure, wherein first locations of the data structure are fixed with respect to an encoding operation and second locations of the data structure are not fixed with respect to the encoding operation;
generate the data structure for the user data and the system metadata based on the mapping, wherein the user data is at the second locations that are not fixed and at least a portion of the system metadata is at the first locations that are fixed; and
perform the encoding operation on the data structure to generate a codeword.

9. The system of claim 8, wherein the encoding operation is performed based on a polar code.

10. The system of claim 9, wherein the fixed locations comprise frozen bits of the polar code and the not fixed locations comprise unfrozen bits of the polar code.

11. The system of claim 9, wherein the system metadata comprises one or more defined values that received from the host system with the host data.

12. The system of claim 11, wherein the system metadata comprises at least one of a logical block address (LBA) or a supplemental metadata field.

13. The system of claim 8, wherein the processing device is further to store the codeword at one or more memory components.

14. The system of claim 8, wherein to determine the portion of the host data that comprises the user data, the processing device is to receive a request to store the host data, wherein the request comprises the user data at a particular offset.

15. A non-transitory computer readable medium comprising instructions, which when executed by a processing device, cause the processing device to perform operations comprising:
receiving host data from a host system;
determining a portion of the host data that comprises user data;
determining another portion of the host data that comprises system metadata;
receiving a mapping for a data structure, wherein first locations of the data structure are fixed with respect to an encoding operation and second locations of the data structure are not fixed with respect to the encoding operation;
generating the data structure for the user data and the system metadata based on the mapping, wherein the user data is at the second locations that are not fixed and at least a portion of the system metadata is at the first locations that are fixed; and
performing the encoding operation on the data structure to generate a codeword.

16. The non-transitory computer readable medium of claim 15, wherein performing the encoding operation is based on a polar code.

17. The non-transitory computer readable medium of claim 16, wherein the fixed locations comprise frozen bits of the polar code and the not fixed locations comprise unfrozen bits of the polar code.

18. The non-transitory computer readable medium of claim 15, wherein the system metadata comprises one or more defined values that received from the host system with the host data.

19. The non-transitory computer readable medium of claim 18, wherein the system metadata comprises at least one of a logical block address (LBA) or a supplemental metadata field.

20. The non-transitory computer readable medium of claim 18, wherein the operations further comprise:
storing the codeword at one or more memory components.

* * * * *